(12) United States Patent
Lee

(10) Patent No.: US 12,506,113 B2
(45) Date of Patent: Dec. 23, 2025

(54) METHOD OF BONDING A SEMICONDUCTOR DIE TO A WAFER

(71) Applicant: SEMES CO., LTD., Cheonan-si (KR)

(72) Inventor: Hang Lim Lee, Cheonan-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 377 days.

(21) Appl. No.: 17/953,750

(22) Filed: Sep. 27, 2022

(65) Prior Publication Data

US 2023/0100455 A1    Mar. 30, 2023

(30) Foreign Application Priority Data

Sep. 29, 2021 (KR) .................. 10-2021-0129106

(51) Int. Cl.
*H01L 23/00* (2006.01)

(52) U.S. Cl.
CPC .... *H01L 24/80* (2013.01); *H01L 2224/80004* (2013.01); *H01L 2224/80011* (2013.01); *H01L 2224/80013* (2013.01); *H01L 2224/80031* (2013.01); *H01L 2224/80203* (2013.01); *H01L 2924/35121* (2013.01)

(58) Field of Classification Search
CPC ............ H01L 2224/80004; H01L 2224/80013
See application file for complete search history.

(56) References Cited

U.S. PATENT DOCUMENTS

| | | | |
|---|---|---|---|
| 6,338,980 B1 * | 1/2002 | Satoh | H01L 21/561 257/E29.022 |
| 10,515,837 B2 | 12/2019 | Kilcoyne et al. | |
| 2015/0318255 A1 * | 11/2015 | Karhade | H01L 24/17 257/737 |
| 2018/0301365 A1 * | 10/2018 | Kilcoyne | H01L 21/30625 |
| 2020/0006099 A1 * | 1/2020 | Yamauchi | H01L 21/67017 |
| 2020/0126948 A1 * | 4/2020 | Lee | H01L 21/6715 |
| 2021/0118858 A1 * | 4/2021 | Yu | H01L 24/80 |

FOREIGN PATENT DOCUMENTS

| | | |
|---|---|---|
| CA | 3059415 A1 | 10/2018 |
| CN | 110199385 B | 3/2021 |
| EP | 3610501 B1 | 1/2024 |
| JP | 6778335 B2 | 10/2020 |
| KR | 2019-0103439 A | 9/2019 |
| KR | 102103811 B1 | 4/2020 |
| KR | 2020-0052080 A | 5/2020 |
| KR | 102170192 B1 | 10/2020 |
| TW | 201541541 A | 11/2015 |
| TW | 1720306 B | 3/2021 |
| WO | 2018/191104 A1 | 10/2018 |

* cited by examiner

*Primary Examiner* — Kevin Parendo
(74) *Attorney, Agent, or Firm* — Harnss, Dickey & Pierce, P.L.C

(57) ABSTRACT

The inventive concept provides a bonding method. The bonding method includes bonding a second bonding object to a first bonding object, which is a bonding step; providing a protective agent to a region of the first bonding object which is not bonded to the second bonding object, which is a protective agent providing step; and etching a backside of the second bonding object, which is an etching step.

16 Claims, 6 Drawing Sheets

METHOD OF BONDING A SEMICONDUCTOR DIE TO A WAFER

CROSS-REFERENCE TO RELATED APPLICATIONS

A claim for priority under 35 U.S.C. § 119 is made to Korean Patent Application No. 10-2021-0129106 filed on Sep. 29, 2021, in the Korean Intellectual Property Office, the entire contents of which are hereby incorporated by reference.

BACKGROUND

Embodiments of the inventive concept described herein relate to a bonding method.

Recently, as an integration degree of semiconductor elements reach a limit, a 3D package technology which three-dimensionally stacks semiconductor elements is drawing attention. As a representative example, a technology for commercializing a 3D integrated circuit using a through silicon via (TSV) is being studied. A three-dimensional semiconductor may be manufactured through a die bonding process in which TSV dies D are stacked and bonded.

This die bonding process uses an adhesion film and a solder bump, which are a bonding medium, to bond a TSV die D onto a master wafer MW. However, recently, as an I/O pitch between TSVs are gradually becoming more refined, a defect may occur due to the connection between the bonding medium (e.g., a solder bump) and the TSV, causing a short circuit. In order to solve this problem, a direct bonding process of bonding the TSV die D and the master wafer MW without using the bonding medium described above has been on the rise.

FIG. 1 is a flowchart of a general direct bonding process, and FIG. 2 illustrates a state in which the die is bonded onto the master wafer through the direct bonding process of FIG. 1.

Referring to FIG. 1 and FIG. 2, the general direct bonding process may include a hydrophilizing treating step S1 for hydrophilizing a bonding surface between the die D and the master wafer MW, a temporary bonding step S2 for temporarily bonding the bonding surface which has been hydrophilized at a room temperature to each other, and a complete bonding step S3 for completely bonding the temporarily bonded die D at a high temperature. In the hydrophilizing treating step S1, the bonding surface is surface-treated using a plasma, and a water is sprayed on a surface-treated bonding surface to form a liquid film. Also, in the temporary bonding step S2 for temporarily bonding the bonding surface which has been hydrophilized at the room temperature to each other, a bonding head temporarily bonds the die D to the bonding surface of the master wafer MW. During a temporary bonding, a first through electrode WE of the master wafer MW and a second through electrode DE of the die D may be aligned with each other. In the complete bonding step S3, a high temperature is transferred to the die D. The first through electrode WE and the second through electrode DE may be expanded by a heat, and thus the first through electrode WE and the second through electrode DE can be bonded to each other.

Recently, as a thickness of the die D has become very thin, the bonding head cannot pressurize the die D when completely bonding. This is because if the die D is pressurized, cracks may occur inside the die D. That is, since the die D is not pressurized when the die D is completely bonding, as shown in FIG. 2, the through electrodes WE and DE may not be bonded, or a bonding of the through electrodes WE and DE may be incomplete. In addition, in some cases, a bonded die D may be peeled off from the master wafer MW due to a heat expansion of the through electrodes WE and DE.

SUMMARY

Embodiments of the inventive concept provide a bonding method for efficiently bonding a die to a master wafer.

Embodiments of the inventive concept provide a bonding method for pressurizing a die to bond to a master wafer.

Embodiments of the inventive concept provide a bonding method for acquiring a bonding quality between an electrode of a master wafer and an electrode of a die, while preventing a damage from occurring on the die.

The technical objectives of the inventive concept are not limited to the above-mentioned ones, and the other unmentioned technical objects will become apparent to those skilled in the art from the following description.

The inventive concept provides a bonding method. The bonding method includes bonding a second bonding object to a first bonding object, which is a bonding step; providing a protective agent to a region of the first bonding object which is not bonded to the second bonding object, which is a protective agent providing step; and etching a backside of the second bonding object, which is an etching step.

In an embodiment, the bonding method further includes removing a protective agent remaining on the first bonding object, which is a protective agent removing step, after the etching step is performed.

In an embodiment, the bonding method further includes processing a thickness of the second bonding object, which is a thickness processing step, before the bonding step is performed, and wherein the thickness processing step processes the thickness of the second bonding object so a process thickness of the second bonding object is thicker than a target thickness.

In an embodiment, the bonding step is performed by pressurizing the second bonding object in a direction closer to the first bonding object.

In an embodiment, the bonding step is performed by pressurizing the second bonding object in a direction closer to the first bonding object, and by heating the first bonding object or the second bonding object.

In an embodiment, the etching step etches a backside of the second bonding object so the thickness of the second bonding object becomes the target thickness from the process thickness.

In an embodiment, the bonding method further includes hydrophilizing a first bonding surface of the first bonding object and a second bonding surface of the second bonding object, which is a hydrophilizing treating step, the first bonding surface and the second bonding surface face each other when bonded together.

In an embodiment, the hydrophilizing treating step is performed by transferring a plasma to the first bonding surface and the second bonding surface.

In an embodiment, the hydrophilizing treating step forms a water film by spraying a liquid including a water on the first bonding surface and the second bonding surface.

In an embodiment, the bonding method further includes temporarily bonding the second bonding object to the first bonding object, which is a temporary bonding step, performed between the hydrophilizing treating step and the bonding step.

The inventive concept provides a bonding method for bonding a die onto a master wafer. The bonding method includes temporarily bonding the die onto the master wafer, which is a temporary bonding step; pressurizing the die in a direction facing the master wafer, which is a main bonding step; and providing a protective agent onto the master wafer, which is a protective agent providing step.

In an embodiment, the bonding method further includes etching a backside of the die exposed to an outside, which is an etching step, after the protective agent providing step.

In an embodiment, the bonding method further includes processing a thickness of the die, which is a thickness processing step, before the temporary bonding step, and wherein the thickness processing step processes a thickness of the die so a process thickness of the die is thicker than a target thickness.

In an embodiment, at the etching step, a backside of the die is etched so the process thickness of the die become the target thickness.

In an embodiment, a bonding head which bonds the die to the master wafer, bonds the die onto the master wafer so a first electrode of the master wafer faces a second electrode of the die.

In an embodiment, at the main bonding step, the die is pressurized in a direction of the master wafer while the die and/or the master wafer is heated.

In an embodiment, the bonding method further includes hydrophilizing the die and the master wafer, which is a hydrophilizing treating step, performed before the temporarily bonding step.

In an embodiment, the hydrophilizing treating step is performed by transferring a plasma to the die and the master wafer.

In an embodiment, the hydrophilizing treating step forms a water film by spraying a liquid including a water on the die and the master wafer, and wherein at the temporary bonding step the die and the master wafer are temporarily bonded by the water film.

The inventive concept provides a bonding method for bonding a die onto a master wafer. The bonding method includes processing a thickness of the die, which is a thickness processing step, the thickness processing step processing the thickness of the die so a process thickness of the die is thicker than a target thickness; hydrophilizing a bonding surface of the die and the master wafer, which is a hydrophilizing treating step, performed after the thickness processing step; picking up the die by the bonding head to load onto the master wafer, which is a temporary bonding step, performed after the hydrophilizing treating step, the bonding head loading the die so a first through electrode of the master wafer and a second through electrode of the die face each other at the temporary bonding step; pressurizing the die in a direction of the master wafer by the bonding head and heating the die and/or the master wafer, which is a main bonding step, performed after the temporary bonding step; providing a protective agent onto the master wafer bonded to the die, which is a protective agent providing step, the protective agent being any one of a thermosetting liquid or a thermosetting film; etching a backside of the die which is exposed to an outside, which is a die etching step, the die etching step etching the backside of the die so the thickness of the die becomes the target thickness; and removing a protective agent remaining on the master wafer, which is a protective agent removing step, which is performed after the die etching step.

According to an embodiment of the inventive concept, a die may be efficiently bonded to a master wafer.

According to an embodiment of the inventive concept, a die may be pressurized to be bonded to a master wafer.

According to an embodiment of the inventive concept, a bonding quality may be acquired between an electrode of a master wafer and an electrode of a die, while preventing a damage from occurring on the die.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
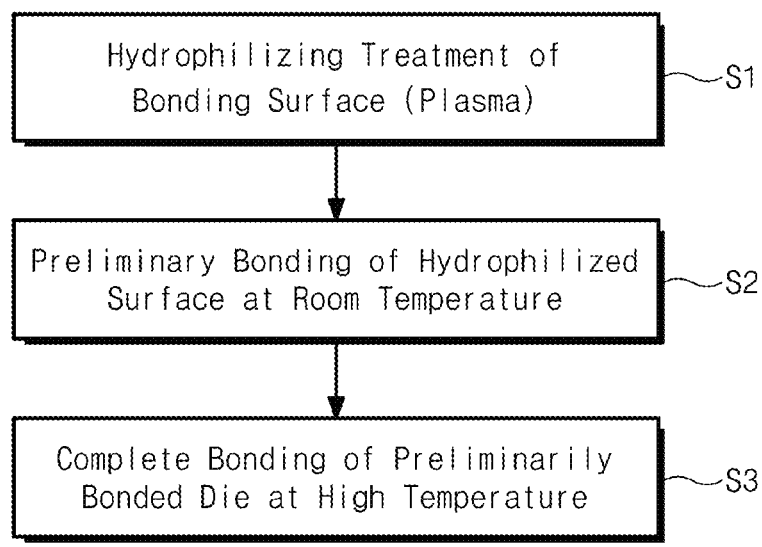
FIG. 1 is a flowchart of a general direct bonding process.
Figure 2:
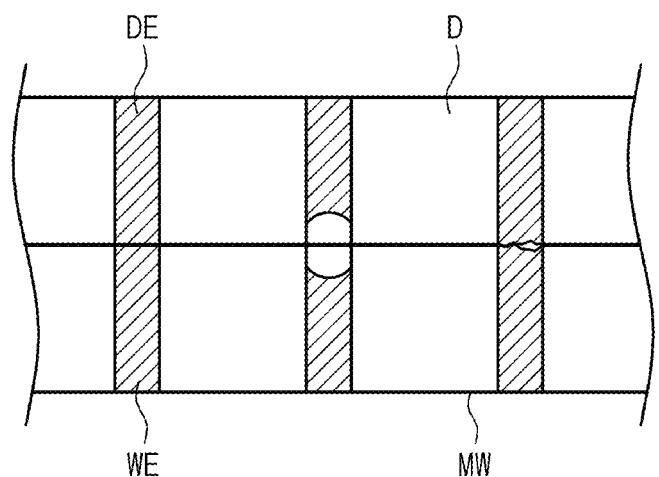
FIG. 2 illustrates a state in which a die is bonded on a master wafer by the direct bonding process of FIG. 1.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising,", "includes", and/or "including" when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "example" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Other terms such as "between", "adjacent", "near" or the like should be interpreted in the same way.

Unless otherwise defined, all terms used herein, including technical or scientific terms, have the same meaning as those generally understood by those skilled in the art to which the inventive concept belongs. Terms such as those defined in commonly used dictionaries should be interpreted as consistent with the context of the relevant technology and not as ideal or excessively formal unless clearly defined in this application.

Hereinafter, an embodiment of the inventive concept will be described with reference to FIG. 3 to FIG. 14.

A bonding method according to an embodiment of the inventive concept may be a direct bonding method in which a master wafer MW (an exemplary the first bonding object) and an aforementioned TSV die D (an exemplary second bonding object) are directly bonded. In addition, the bonding method according to an embodiment of the inventive concept may be applied equally or similarly even if a first substrate (another exemplary first bonding object) and a second substrate (another exemplary second bonding object) are bonded to each other. Hereinafter, a bonding of the TSV die D (for example, a semiconductor chip, etc.) onto the master wafer MW (for example, a semiconductor substrate or a glass substrate) will be described as an example.

Figure 3:
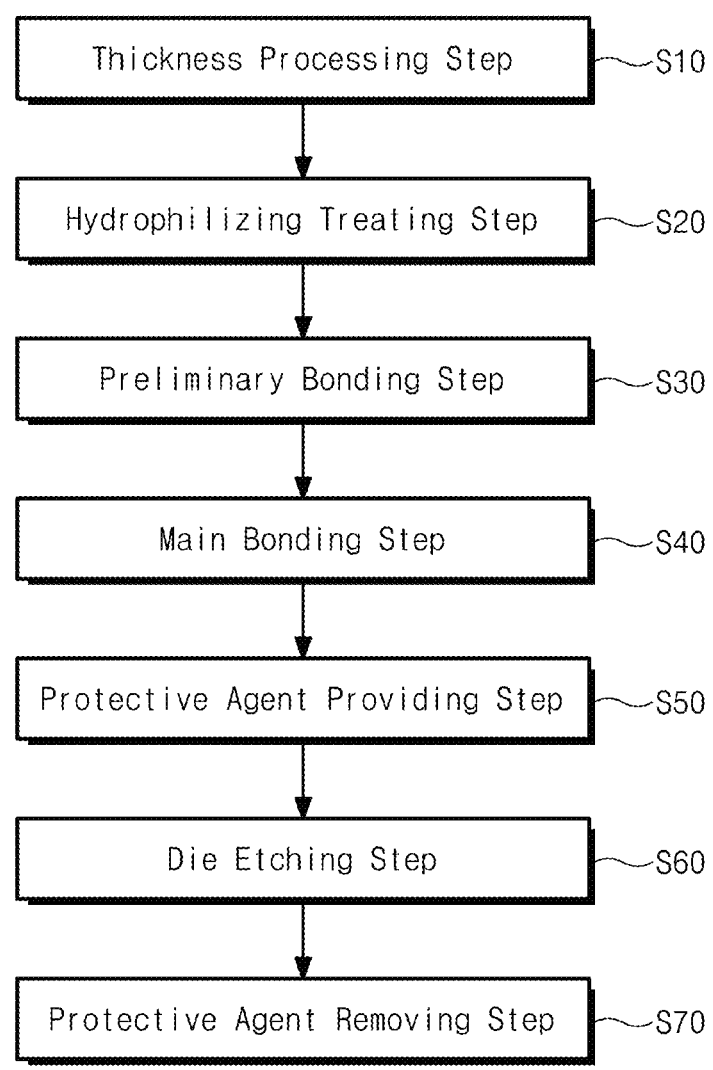
FIG. 3 is a flowchart illustrating a bonding method according to an embodiment of the inventive concept.
Figure 4:
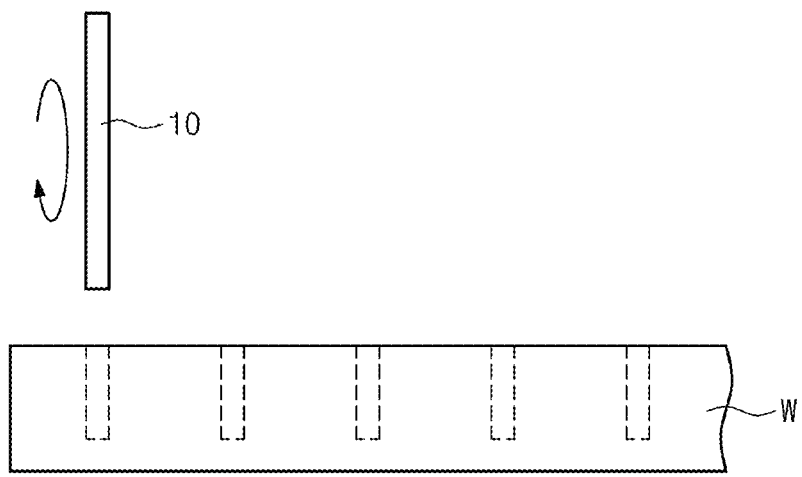
FIG. 4 and FIG. 5 illustrate a state in which a thickness processing step of FIG. 3 is performed.
Figure 5:
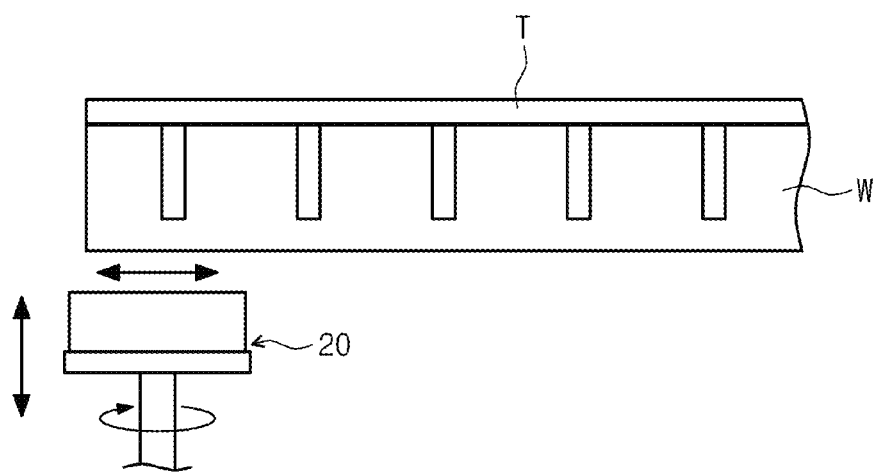
Figure 6:
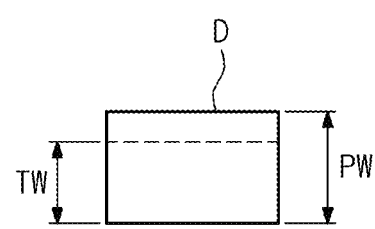
FIG. 6 is a view showing a die manufactured by completing the thickness processing step of FIG. 3.
Figure 7:
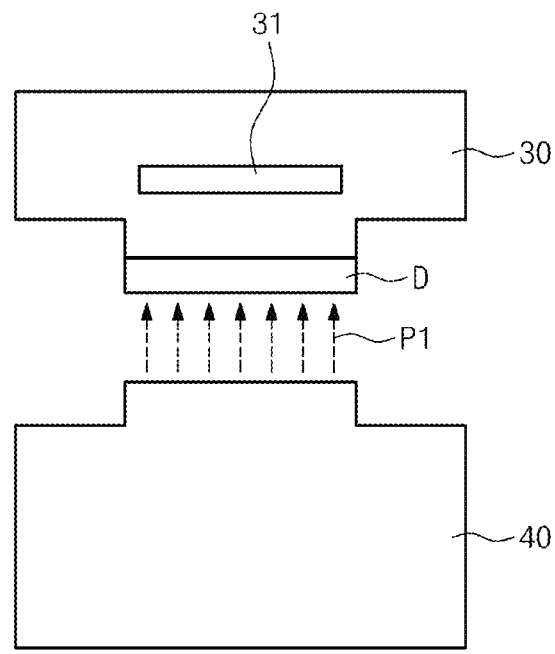
FIG. 7 and FIG. 8 illustrate a state in which a hydrophilizing treating step of FIG. 3 is performed.
Figure 8:
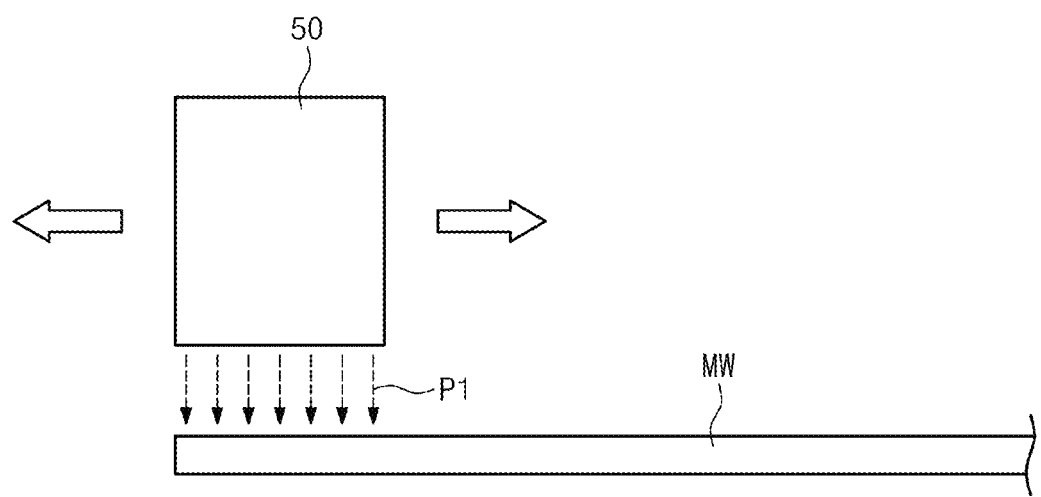
Figure 9:
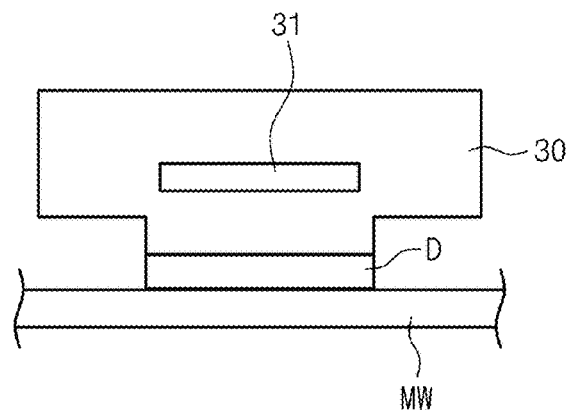
FIG. 9 illustrates a state in which a temporary bonding step of FIG. 3 is performed.
Figure 10:
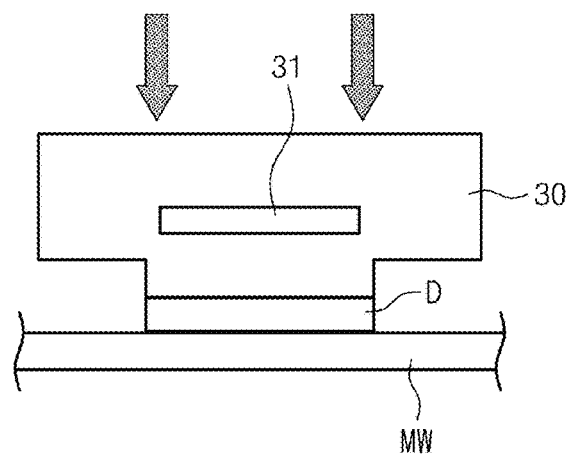
FIG. 10 illustrates a state in which a main bonding step of FIG. 3 is performed.

FIG. 3 is a flowchart illustrating a bonding method according to an embodiment of the inventive concept. Referring to FIG. 3, the bonding method according to an embodiment of the inventive concept may include a thickness processing step S10, a hydrophilizing treating step S20, a temporary bonding step S30, a main bonding step S40, a protective agent providing step S50, a die etching step S60, and a protective agent removing step S70. The thickness processing step S10, the hydrophilizing treating step S20, the temporary bonding step S30, the main bonding step S40, the protective agent providing step S50, the die etching step S60, and the protective agent removing step S70 may be sequentially performed. For example, the thickness processing step S10 may be performed first, and the protective agent removing step S70 may be performed last.

The thickness processing step S10 may be a step of processing a thickness of the die D. A groove of a predetermined depth may be formed on the substrate W using a rotating blade 10 (see FIG. 4), a tape T may be attached to a surface of the substrate W having the groove, and another surface of the substrate W to which the tape T is attached may be polished by a polishing pad 20 to process the thickness (see FIG. 5). A process thickness PW of the die D in which this thickness processing step S10 has been performed may be processed to be thicker than a target thickness TW (see FIG. 6). The process thickness PW may be a thickness in which cracks do not occur in the die D even if a bonding head 30 pressurizes the die D in the main bonding step S40 to be described later. The process thickness PW may be determined based on an experimental data performed in advance.

In the above-described example, the blade 10 is used to separate the die D having a transistor engraved on the substrate W (e.g., a wafer) as an example, but the inventive concept is not limited thereto. For example, separating the die D from the substrate W may be done by various known dicing methods such as a laser dicing or a plasma dicing using a plasma.

Also, in the above-described example, adjusting the thickness of the die D by causing a friction with the rotating polishing pad 20 and the die D was been described as an example, but the inventive concept is not limited thereto. For example, regarding the thickness processing of the die D, the thickness of the die D may be adjusted by supplying a chemical, or through a chemical polishing method by supplying a chemical and a mechanical polishing method using the polishing pad 20.

The hydrophilizing treating step S20 may be a step of hydrophilizing a bonding surface of the master wafer MW and/or the die D. For example, a first plasma treating unit 40 may transfer a first plasma P1 to a second bonding surface of the die D (see FIG. 7) to hydrophilize the second bonding surface of the die D (see FIG. 7), and a second plasma treating unit 50 may transfer the first plasma P1 to a first bonding surface of the master wafer MW to hydrophilize the first bonding surface of the master wafer MW. While the first plasma P1 is transferred to the master wafer MW, the master wafer MW may be supported by a bonding stage (not shown). In addition, while the first plasma P1 is transferred to the die D, the die D may be picked up by the bonding head.

In addition, the plasma treating units 40 and 50 which transfers the first plasma P1 to the master wafer MW and the die D may be an atmospheric pressure (normal pressure) plasma apparatus which generates the first plasma P1 at the atmospheric pressure (normal pressure). If the first plasma P1 is transferred to the master wafer MW and the die D, the bonding surface of the master wafer MW and the die D may be surface-treated. A liquid containing water may be sprayed on the bonding surface of a surface-treated master wafer MW and the die D to form a water film (liquid film). The liquid supplied for forming the water film may be, for example, a deionized water DIW. If a sufficient bonding force may be obtained by only a plasma treatment according to a material (semiconductor, metal, glass, etc.) of a bonding surface of a type (die or substrate) of a bonding object, a plasma treatment type, or a main bonding method, a process of spraying the liquid including water may be omitted.

The temporary bonding step S30 may be performed after the hydrophilizing treating step S20. In the temporary bonding step S30, the hydrophilizing treating step S20 may be performed to load a die D of which a bonding surface is hydrophilized onto a master wafer MW of which the bonding surface is hydrophilized (see FIG. 9). In the temporary bonding step S30, the bonding head 30 may pick up the die D and load it on the master wafer MW. The bonding head 30 may load the die D so that a first through electrode WE of the master wafer MW and a second through electrode DE of the die D face each other.

The main bonding step S40 may be performed after the temporary bonding step S30. In the main bonding step S40, a die D loaded on the master wafer MW supported on the bonding stage may be pressurized (see FIG. 10). For example, in the main bonding step S40, the bonding head 30 may press the die D in a direction (e.g., a downward direction) toward the master wafer MW. In this case, the bonding head 30 may pressurize the die D with a pressure of about 1 to 2 bar. Also, while the bonding head 30 pressurizes the die D, a heater 31 that may be provided at the bonding head 30 may heat the die D. That is, at the main bonding step S40, the die D may be heated while the die D is pressurized. In addition, in the main bonding step S40, the master wafer MW may also be heated by a heating member that may be provided at the bonding stage. That is, in the main bonding step S40, a thermal compression of annealing the die D and/or the master wafer MW may be performed while pressurizing the die D.

Figure 11:
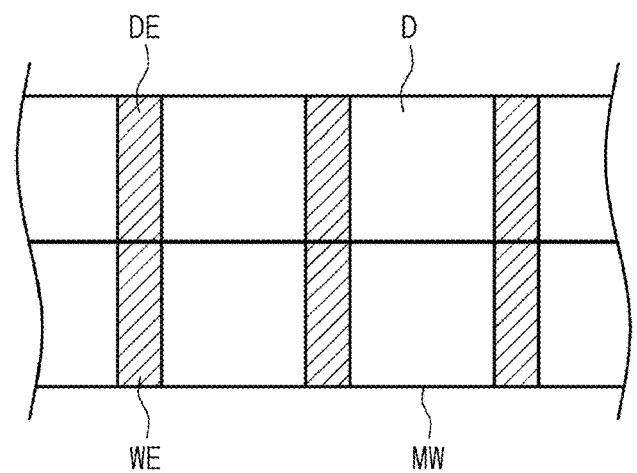
FIG. 11 illustrates a state of the die and the master wafer in which the main bonding step of FIG. 10 is performed.
Figure 12:
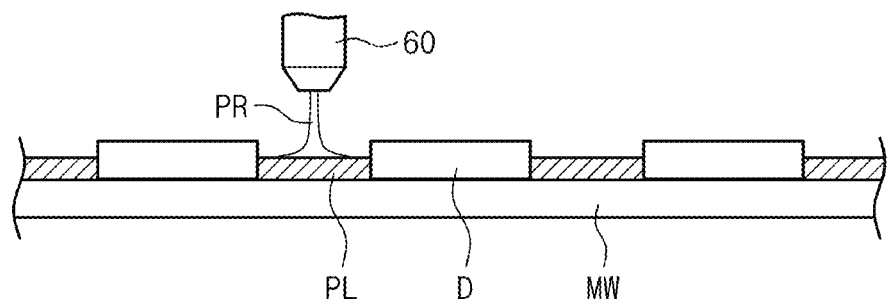
FIG. 12 illustrates a state in which a protective agent providing step of FIG. 3 is performed.
Figure 13:
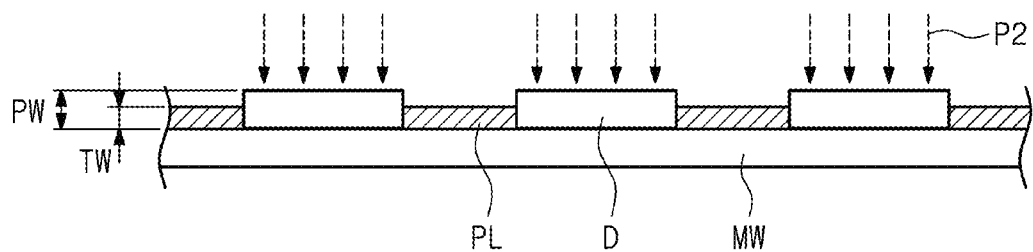
FIG. 13 illustrates a state in which an etching step of FIG. 3 is performed.
Figure 14:
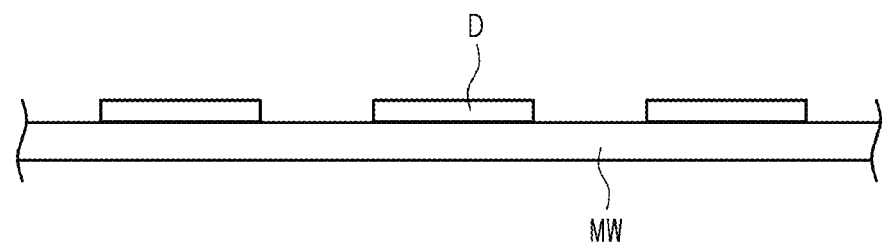
FIG. 14 illustrates a state of the die and the master wafer in which the protective agent removing step of FIG. 3 is performed.

Since the die D and/or the master wafer MW are heated while pressurizing the die D, the first through electrode WE of the master wafer MW and the second through electrode DE of the die D may be completely bonded to each other (see FIG. 11). If the die D and/or the master wafer MW are heated while pressurizing the die D, a complete bonding is possible between the first through electrode WE including a Cu and the second through electrode DE including a Cu. In addition, as described above, the die D is manufactured to have a process thickness PW which is thicker than the target thickness TW. Accordingly, even if the bonding head 30 pressurizes the die D, a damage such as cracks do not occur at the die D.

In the protective agent providing step S50, a protective agent capable of performing a role of a protective layer, for example, a mask, at the die etching step S60 to be described later may be provided. In the protective agent providing step S50, a thermosetting protective agent such as a photoresist PR or a thermosetting ink may be provided to a region of the master wafer MW at which the die D has not bonded (see FIG. 12). A protective layer PL may prevent a remaining region except for the region to which the die D is bonded (e.g., the master wafer MW) from being etched at the die etching step S60 to be described later.

The liquid supply unit 60 may be configured to supply the photoresist PR onto the master wafer MW to which the die D has not attached to by an inkjet method. In addition, the liquid supply unit 60 may supply the photoresist PR on a region of the master wafer MW to which the die D is not attached to in a stream manner. In addition, the liquid supply unit 60 may supply a photoresist PR in an amount in which the protective layer PL does not cover a top surface of the die D.

In some cases, an amount sufficient for the photoresist PR to cover the top surface of the die D may be supplied. In a case of adopting this method, a chemical C for removing the photoresist PR may be supplied onto the master wafer MW to which the die D is attached so that the top surface of the die D is exposed.

In addition, in some cases, after the photoresist PR is supplied to form the protective layer PL, properties of the protective layer PL may be changed by irradiating a light to an area to which the die D is attached, and a developing liquid may be supplied to a protective layer PL which properties have changed to expose the top surface of the die D to the outside. In addition, after the photoresist PR is supplied to form the protective layer PL, the properties of the protective layer PL may be changed by irradiating the light to a region to which the die D is attached, and a plasma may be supplied to the protective layer PL which properties have changed to expose the top surface of the die D to the outside.

Also, in the aforementioned example, forming the protective layer PL by supplying the photoresist PR which may be a thermosetting liquid has been described, but the inventive concept is not limited to it. For example, the above-described protective agent may be a thermosetting film.

In the die etching step S60, a backside of the die D exposed to the outside may be etched. A backside of the die D etched in the die etching step S60 may be a surface opposite to the second bonding surface of the die D described above. In the die etching step S60, the second plasma P2 may be transferred to the die D to etch the backside of the die D (see FIG. 13). In the die etching step S60, the backside of the die D may be etched so that the thickness of the die D becomes the target thickness TW from the process thickness PW.

Also, in the aforementioned example, it has been described that the die etching step S60 is performed by transferring the second plasma P2 to the die D, but it is not limited thereto. For example, the die etching step S60 may be performed by supplying the chemical for etching the backside of the die D. Unlike this, the die etching step S60 may be performed through a physical etching using a polishing pad or the like on the backside of the die D.

The protective agent removing step S70 may be performed after the die etching step S60. The protective agent removing step S70 may be a step of removing the protective layer PL that has performed as a mask during the die etching step S60. In the protective agent removing step S70, a chemical such as a cleaning liquid may be supplied onto the master wafer MW to remove a protective agent remaining on the master wafer MW (see FIG. 14).

According to an embodiment of the inventive concept, the die D is processed to be thicker than the target thickness TW. The process thickness PW of the die D may be a thickness in which cracks do not occur even if pressurized by the bonding head 30. Accordingly, according to an embodiment of the inventive concept, at the main bonding step S40, a thermal compression may be possible, thereby solving a problem in that the through electrodes are not bonded to each other or the die D is peeled off from the master wafer MW as described above. In addition, the protective layer PL performing as a mask is formed (the protective layer PL protects the master wafer MW), the backside of the die D is etched, and then the protective layer PL is removed to process the die D to an originally targeted target thickness TW. That is, according to an embodiment of the inventive concept, it is possible to improve a production yield by removing a bonding failure of the die to the master wafer.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A bonding method comprising:
hydrophilizing a first bonding surface of a first bonding object and a second bonding surface of a second bonding object, which is a hydrophilizing treating operation,
temporarily bonding the second bonding object to the first bonding object, which is a temporary bonding operation, performed after the hydrophilizing treating operation,
bonding the second bonding object to the first bonding object, which is a bonding operation, performed after the temporary bonding operation;
providing a protective agent to a region of the first bonding object which is not bonded to the second bonding object, which is a protective agent providing operation;
etching a backside of the second bonding object, which is an etching operation; and
fully removing the protective agent remaining on the first bonding object, which is a protective agent removing operation, after the etching operation is performed,
wherein, in the temporary bonding operation, the first bonding object and the second bonding object are aligned such that a first electrode of the first bonding object faces a second electrode of the second bonding object.

2. The bonding method of claim 1, further comprising processing a thickness of the second bonding object, which is a thickness processing operation, before the hydrophilizing treating operation is performed, and
wherein the thickness processing operation processes the thickness of the second bonding object so a process thickness of the second bonding object is thicker than a target thickness.

3. The bonding method of claim 2, wherein the bonding operation is performed by pressurizing the second bonding object in a direction closer to the first bonding object.

4. The bonding method of claim 3, wherein the bonding operation is performed by pressurizing the second bonding object in the direction closer to the first bonding object, and by heating the first bonding object or the second bonding object.

5. The bonding method of claim 2, wherein the etching operation etches the backside of the second bonding object so the thickness of the second bonding object becomes the target thickness from the process thickness.

6. The bonding method of claim 1, wherein the hydrophilizing treating operation is performed by transferring a plasma to the first bonding surface and the second bonding surface.

7. The bonding method of claim 6, wherein the hydrophilizing treating operation forms a water film by spraying a liquid including a water on the first bonding surface and the second bonding surface.

8. A bonding method for bonding a die onto a master wafer comprising:
hydrophilizing the die and the master wafer, which is a hydrophilizing treating operation;
temporarily bonding the die onto the master wafer, which is a temporary bonding operation, performed after the hydrophilizing treating operation;
pressurizing the die in a direction facing the master wafer, which is a main bonding operation, performed after the temporary bonding operation;
providing a protective agent onto the master wafer, which is a protective agent providing operation, performed after the main bonding operation; and
fully removing the protective agent remaining on the master wafer, which is a protective agent removing operation,
wherein, in the temporary bonding operation, the die is aligned such that a first electrode of the master wafer faces a second electrode of the die.

9. The bonding method of claim 8, further comprising etching a backside of the die exposed to an outside, which is an etching operation, after the protective agent providing operation and before the protective agent removing operation.

10. The bonding method of claim 9, further comprising processing a thickness of the die, which is a thickness processing operation, performed before the hydrophilizing treating operation, and
wherein the thickness processing operation processes the thickness of the die so a process thickness of the die is thicker than a target thickness.

11. The bonding method of claim 10, wherein at the etching operation, the backside of the die is etched so the process thickness of the die become the target thickness.

12. The bonding method of claim 8, wherein a bonding head which bonds the die to the master wafer, bonds the die onto the master wafer so the first electrode of the master wafer faces the second electrode of the die, in the main bonding operation.

13. The bonding method of claim 8, wherein at the main bonding operation, the die is pressurized in a direction of the master wafer while the die and/or the master wafer is heated.

14. The bonding method of claim 8, wherein the hydrophilizing treating operation is performed by transferring a plasma to the die and the master wafer.

15. The bonding method of claim 14, wherein the hydrophilizing treating operation forms a water film by spraying a liquid including a water on the die and the master wafer, and
wherein at the temporary bonding operation the die and the master wafer are temporarily bonded by the water film.

16. A bonding method for bonding a die onto a master wafer comprising:
processing a thickness of the die, which is a thickness processing operation, the thickness processing operation processing the thickness of the die so a process thickness of the die is thicker than a target thickness;
hydrophilizing a bonding surface of the die and the master wafer, which is a hydrophilizing treating operation, performed after the thickness processing operation;
picking up the die by a bonding head to load onto the master wafer, which is a temporary bonding operation, performed after the hydrophilizing treating operation, the bonding head loading the die so a first through electrode of the master wafer and a second through electrode of the die face each other at the temporary bonding operation;
pressurizing the die in a direction of the master wafer by the bonding head and heating the die and/or the master wafer, which is a main bonding operation, performed after the temporary bonding operation;
providing a protective agent onto the master wafer bonded to the die, which is a protective agent providing operation, the protective agent being any one of a thermosetting liquid or a thermosetting film;

etching a backside of the die which is exposed to an outside, which is a die etching operation, the die etching operation etching the backside of the die so the thickness of the die becomes the target thickness; and removing all of the protective agent remaining on the master wafer, which is a protective agent removing operation, which is performed after the die etching operation.

* * * * *